(12) United States Patent
Fujimori et al.

(10) Patent No.: US 10,916,729 B2
(45) Date of Patent: Feb. 9, 2021

(54) LIGHT-EMITTING DISPLAY DEVICE INCLUDING BARRIER FILM WITH ORGANIC MATERIAL TO SUPPRESS MOISTURE

(71) Applicant: JOLED INC., Tokyo (JP)

(72) Inventors: Takashige Fujimori, Tokyo (JP); Yuichiro Ishiyama, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 16/521,699

(22) Filed: Jul. 25, 2019

(65) Prior Publication Data
US 2020/0035947 A1 Jan. 30, 2020

(30) Foreign Application Priority Data
Jul. 27, 2018 (JP) .................. 2018-141797

(51) Int. Cl.
| | | |
|---|---|---|
| H01L 29/08 | (2006.01) | |
| H01L 51/52 | (2006.01) | |
| H01L 51/00 | (2006.01) | |
| C23C 16/40 | (2006.01) | |
| C23C 16/34 | (2006.01) | |
| C23C 16/513 | (2006.01) | |

(52) U.S. Cl.
CPC ........ *H01L 51/5253* (2013.01); *C23C 16/345* (2013.01); *C23C 16/402* (2013.01); *C23C 16/403* (2013.01); *C23C 16/513* (2013.01); *H01L 51/0097* (2013.01)

(58) Field of Classification Search
CPC ............. H01L 51/5253; H01L 51/0097; H01L 257/40; H01L 51/0096; H01L 51/56; C23C 16/345; C23C 16/402; C23C 16/403; C23C 16/513; Y02E 10/549
USPC .......................................................... 257/40
See application file for complete search history.

(56) References Cited

U.S. PATENT DOCUMENTS

| | | | | |
|---|---|---|---|---|
| 5,790,304 A | * | 8/1998 | Sanders ............... | B64G 1/226 359/359 |
| 7,199,518 B2 | * | 4/2007 | Couillard ............ | H01L 51/5253 313/504 |
| 2014/0077187 A1 | * | 3/2014 | Lee ..................... | H01L 51/5284 257/40 |
| 2016/0043346 A1 | | 2/2016 | Kamiya et al. | |

(Continued)

FOREIGN PATENT DOCUMENTS

| | | |
|---|---|---|
| JP | 2011-054897 A | 3/2011 |
| JP | 2016-039120 A | 3/2016 |

(Continued)

*Primary Examiner* — Caleb E Henry
(74) *Attorney, Agent, or Firm* — Greenblum & Bernstein, P.L.C.

(57) ABSTRACT

A light-emitting display device includes an element-formation substrate and a plurality of pixels. The element-formation substrate includes a first barrier film and a second barrier film provided on a substrate, the first barrier film and the second barrier film being provided in the stated order from the substrate and suppressing ingress of moisture. The plurality of pixels is provided on the element-formation substrate. The element-formation substrate further includes an organic part that fills a crack occurred in the first barrier film, or that is attached around a part of a metallic foreign substance protruding from the first barrier film.

8 Claims, 7 Drawing Sheets

(56) References Cited

U.S. PATENT DOCUMENTS

| | | | |
|---|---|---|---|
| 2016/0118620 A1* | 4/2016 | Yoo | H01L 51/0035 |
| | | | 257/40 |
| 2016/0293884 A1* | 10/2016 | Zhang | H05B 45/60 |
| 2017/0092897 A1* | 3/2017 | Liu | H01L 51/5256 |
| 2017/0243926 A1 | 8/2017 | Kamiya | |
| 2017/0373274 A1 | 12/2017 | Kokame | |
| 2018/0088390 A1 | 3/2018 | Ohara | |
| 2018/0342693 A1* | 11/2018 | Sato | H01L 51/0097 |
| 2019/0058160 A1* | 2/2019 | Kishimoto | H01L 27/3276 |

FOREIGN PATENT DOCUMENTS

| | | |
|---|---|---|
| JP | 2017-152188 A | 8/2017 |
| JP | 2017-228480 A | 12/2017 |
| JP | 2018-013697 A | 1/2018 |
| JP | 6301042 | 3/2018 |
| JP | 2018-054675 A | 4/2018 |

* cited by examiner

LIGHT-EMITTING DISPLAY DEVICE INCLUDING BARRIER FILM WITH ORGANIC MATERIAL TO SUPPRESS MOISTURE

CROSS REFERENCE TO RELATED APPLICATIONS

This application claims the benefit of Japanese Priority Patent Application No. 2018-141797 filed on Jul. 27, 2018, the entire contents of which are incorporated herein by reference.

BACKGROUND

The disclosure relates to a light-emitting display device, and particularly relates to a light-emitting display device including a barrier film that includes an inorganic material which is provided on a substrate.

Typical examples of the light-emitting display device include an organic electroluminescence (EL) display element. In a light-emitting display device, a current flows in an organic compound included in a layer (hereinafter, referred to as EL layer) sandwiched between a pair of electrodes. Therefore, the organic compound is oxidized or reduced while the light-emitting element is driven, and may be in a state of being electrically-charged. Moreover, recombination of those active species results in an excited state. Those active species and molecules in the excited state are more reactive than molecules in an electrically neutral state or in the ground state, and thereby react with other organic compound or easily react with impurities, such as water or oxygen, that enter the light-emitting element. Such reactions adversely affect characteristics of the light-emitting element, and reduce efficiency and life of the light-emitting element. Accordingly, a display device is proposed that suppresses ingress of moisture into an organic EL element. Reference is made to Japanese Unexamined Patent Application Publication No. 2017-152188, for example.

SUMMARY

There is a demand for a light-emitting display device that has further enhanced moisture resistance.

It is desired to provide a light-emitting display device that makes it possible to further enhance moisture resistance.

A method of manufacturing a light-emitting display device according to an example embodiment includes forming a first barrier film on a substrate, forming an organic layer on the first barrier film, and forming a second barrier film on a surface including the organic layer. The first barrier film suppresses ingress of moisture. The organic layer has a thickness smaller than a thickness of the substrate. The second barrier film suppresses ingress of moisture.

A light-emitting display device according to an example embodiment includes an element-formation substrate and a plurality of pixels. The element-formation substrate includes a first barrier film and a second barrier film provided on a substrate, the first barrier film and the second barrier film being provided in the stated order from the substrate and suppressing ingress of moisture. The plurality of pixels is provided on the element-formation substrate. The element-formation substrate further includes an organic part that fills a crack occurred in the first barrier film, or that is attached around a part of a metallic foreign substance, the part of the metallic foreign substance protruding from the first barrier film.

A light-emitting display device according to an example embodiment includes an element-formation substrate and a plurality of pixels. The element-formation substrate includes a first barrier film and a second barrier film provided on a substrate, the first barrier film and the second barrier film being provided in the stated order from the substrate and suppressing ingress of moisture. The plurality of pixels is provided on the element-formation substrate. The element-formation substrate includes an organic layer that fills a crack occurred in the first barrier film, or that covers a part of a metallic foreign substance, the part of the metallic foreign substance protruding from the first barrier film, the organic layer being provided between the first barrier film and the second barrier film.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to explain the principles of the disclosure.

DETAILED DESCRIPTION

Figure 1:
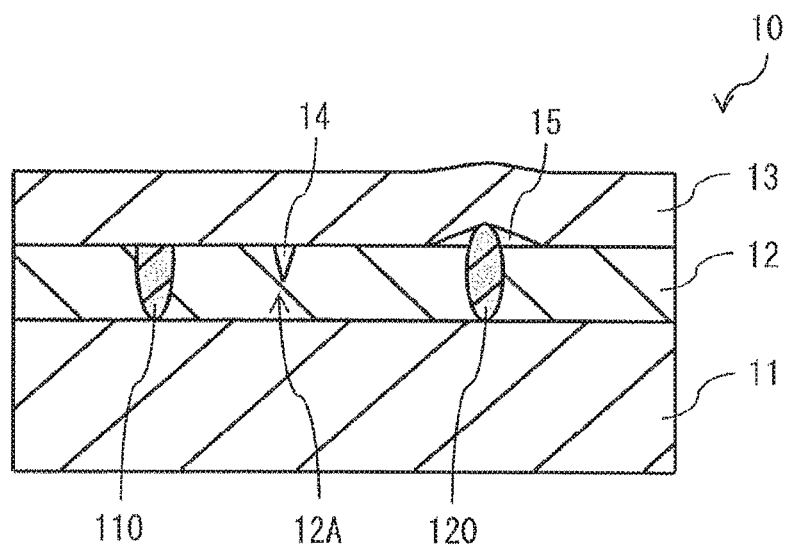
FIG. 1 is a diagram illustrating an example of a cross-sectional configuration of an element-formation substrate according to one example embodiment of the disclosure.

In the following, some example embodiments of the disclosure are described in detail, in the following order, with reference to the accompanying drawings. Note that the following description is directed to illustrative examples of the disclosure and not to be construed as limiting to the disclosure. Factors including, without limitation, numerical values, shapes, materials, components, positions of the components are coupled to each other are illustrative only and not to be construed as limiting to the disclosure. Further, elements in the following example embodiments which are not recited in a most-generic independent claim of the disclosure are optional and may be provided on an as-needed basis. The drawings are schematic and are not intended to be drawn to scale. Note that the like elements are denoted with the same reference numerals, and any redundant description thereof will not be described in detail. Note that the description is given in the following order.

1. First Embodiment (element-formation substrate, organic EL panel)
2. Modification Example of First Embodiment (organic EL panel)
3. Second Embodiment (element-formation substrate, organic EL panel)

1. First Embodiment

[Configuration]

FIG. 1 is a diagram illustrating an example of a cross-sectional configuration of an element-formation substrate 10 according to one example embodiment of the disclosure. The element-formation substrate 10 may be suitably used as a substrate for forming an element easily influenced by moisture. The element mentioned herein refers to an element whose characteristics are easily degraded due to ingress of moisture. Non-limiting examples of the element easily influenced by moisture include an organic EL element and an active element including an oxide semiconductor or low-temperature polycrystalline silicon.

The element-formation substrate 10 is a substrate that has two barrier films 12 and 13 provided on a substrate 11. In one embodiment of the disclosure, the barrier film 12 corresponds to a specific but non-limiting example of a "first barrier film". In one embodiment of the disclosure, the barrier film 13 corresponds to a specific but non-limiting example of a "second barrier film". The substrate 11 may be a flexible substrate, which may include a resin substrate having flexibility. Non-limiting examples of the resin used for the substrate 11 may include plastics such as polyimide (PI), polyethylene terephthalate (PET), polyether sulfone (PES), polyethylene naphthalate (PEN), or polycarbonate (PC). For example, the resin used for the substrate 11 may have a property that makes it possible to resist processing temperatures at which respective elements to be described later are formed over the element-formation substrate 10. That is, for example, the resin used for the substrate 11 may have high-temperature heat resistance. For example, the substrate 11 may be formed by applying a resin over a support base and causing the resin to cure. The substrate 11 may have a thickness of 10 μm, for example.

The barrier films 12 and 13 suppress ingress of moisture into each element (to be described later) provided on the element-formation substrate 10. The barrier films 12 and 13 may each include, for example, an inorganic material, such as $SiO_2$, SiN, SiON, $Al_2O_3$, or SiO. The material of the barrier film 12 and the material of the barrier film 13 may be identical to or different from each other. The barrier film 12 may have a single-layer structure including an inorganic material, or may also have a stacked structure including inorganic materials. The barrier film 13 may have a single-layer structure including an inorganic material, or may also have a stacked structure including inorganic materials. The barrier film 12 may be, for example, a single-layer film including $SiO_2$, SiN, SiON, $Al_2O_3$, or SiO, or may also be, for example, a stacked film including two or more selected from the group consisting of $SiO_2$, SiN, SiON, $Al_2O_3$, and SiO. The barrier film 13 may be, for example, a single-layer film including $SiO_2$, SiN, SiON, $Al_2O_3$, or SiO, or may also be, for example, a stacked film including two or more selected from the group consisting of $SiO_2$, SiN, SiON, $Al_2O_3$, and SiO. The barrier films 12 and 13 may be formed by, for example, plasma-enhanced chemical vapor deposition (PECVD), atomic layer deposition (ALD), or sputtering. The barrier films 12 and 13 may have a thickness of less than 1 μm, and the thickness may be in the range of more than or equal to 100 nm and less than or equal to 600 nm, for example.

Foreign substances can be mixed in the element-formation substrate 10 during a process of manufacturing the element-formation substrate 10. Non-limiting examples of the foreign substances that can be mixed in the element-formation substrate 10 include, as illustrated in FIG. 1, an organic foreign substance 110 and a metallic foreign substance 120. The organic foreign substance 110 and the metallic foreign substance 120 may be attached to a surface on which the barrier film 12 is provided (i.e., a top surface of the substrate 11) during a process of manufacturing the element-formation substrate 10. The organic foreign substance 110 may include, for example, plastics such as polyimide (PI), polyethylene terephthalate (PET), polyether sulfone (PES), polyethylene naphthalate (PEN), or polycarbonate (PC). The metallic foreign substance 120 may include, for example, metals such as stainless steel (SUS), aluminum (Al), iron (Fe), or copper (Cu).

The organic foreign substance 110 and the metallic foreign substance 120 may penetrate through the barrier film 12. A top surface of the organic foreign substance 110 may be leveled with a top surface of the barrier film 12, for example. A top part of the metallic foreign substance 120 may protrude from the barrier film 12, and a side surface of the top part of the metallic foreign substance 120 may be in a tapered shape. An organic part 15 may be attached around the top part of the metallic foreign substance 120. That is, in a case where the metallic foreign substance 120 having a part (top part) protruding from the barrier film 12 exists, the element-formation substrate 10 may include the organic part 15 attached around the part (top part) of the metallic foreign substance 120 protruding from the barrier film 12. In one embodiment of the disclosure, the organic part 15 corresponds to a specific but non-limiting example of a "second organic part". The organic part 15 may join the surface of the metallic foreign substance 120 with the surface of the barrier film 12 more smoothly compared to a case where the organic part 15 is not provided.

The organic part 15 may be provided at a boundary between the barrier film 12 and the barrier film 13. It may be possible that the barrier film 12 has a crack 12A during a process of manufacturing the barrier film 12. The crack 12A may penetrate through the barrier film 12, but in some cases, the crack 12A may not penetrate through the barrier film 12 and may be formed only on the top surface of the barrier film 12. The crack 12A may be filled with an organic part 14. That is, in a case where the barrier film 12 has the crack 12A, the element-formation substrate 10 may include the organic part 14 that fills the crack 12A. In one embodiment of the disclosure, the organic part 14 corresponds to a specific but non-limiting example of a "first organic part". The organic parts 14 and 15 may include, for example, a resin material that is common to a material of the substrate 11. Note that the organic parts 14 and 15 may include a resin material that is different from a material of the substrate 11.

[Manufacturing Method]

Figure 2A:
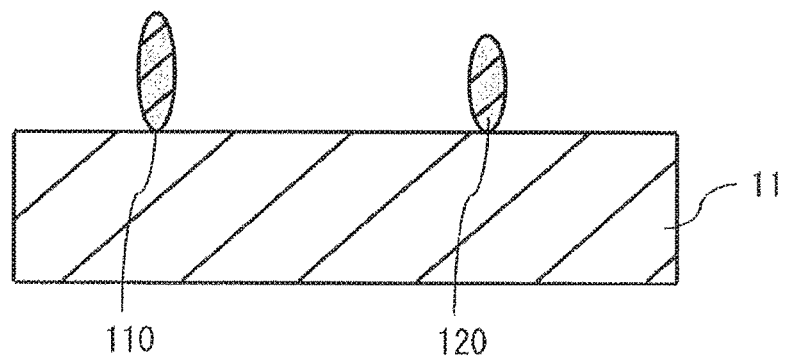
FIG. 2A is a diagram illustrating an example of a method of manufacturing the element-formation substrate illustrated in FIG. 1.
Figure 2B:
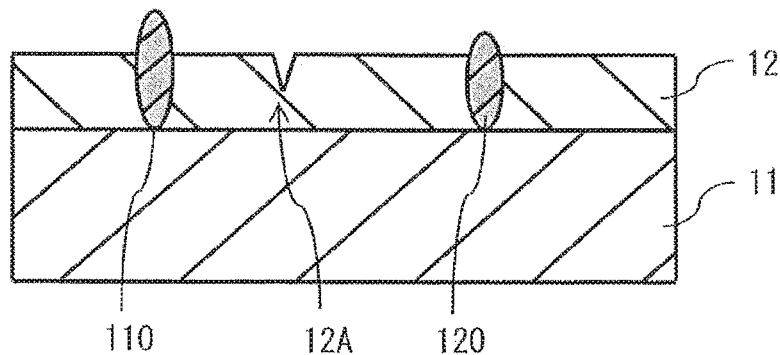
FIG. 2B is a diagram illustrating an example of a manufacturing process following the process illustrated in FIG. 2A.

Next, a method of manufacturing the element-formation substrate 10 is described below. FIGS. 2A to 2D illustrate a process of manufacturing the element-formation substrate 10. First, as illustrated in FIG. 2A, the substrate 11 may be formed by applying a resin over a support base and causing the resin to cure. Here, let us assume that foreign substances (the organic foreign substance 110 and the metallic foreign substance 120) as illustrated in FIG. 2A, for example, are attached on the substrate 11. In this case, the substrate 11 may include a resin material that is common to a material of the organic layer 16 to be formed later. Next, as illustrated in FIG. 2B, the barrier film 12 may be formed over the substrate 11 using PECVD, for example. In this example, the organic foreign substance 110 and the metallic foreign substance 120 penetrate through the barrier film 12, and the crack 12A occurs on the top surface of the barrier film 12.

Figure 2C:
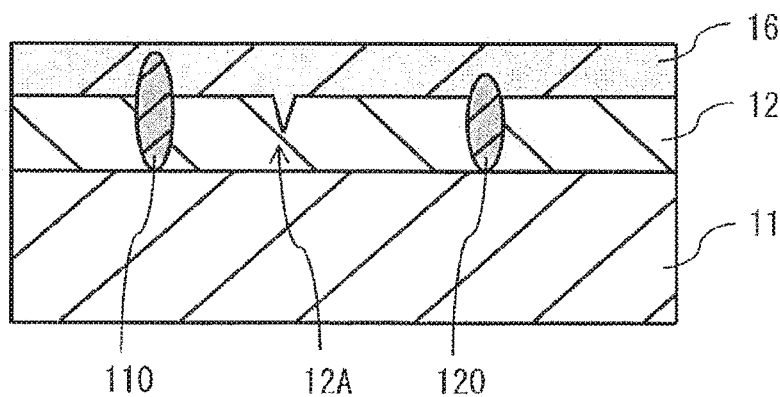
FIG. 2C is a diagram illustrating an example of a manufacturing process following the process illustrated in FIG. 2B.
Figure 2D:
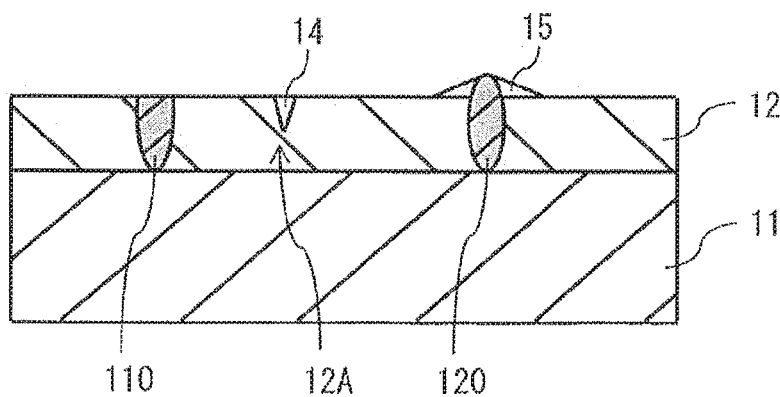
FIG. 2D is a diagram illustrating an example of a manufacturing process following the process illustrated in FIG. 2C.

Next, as illustrated in FIG. 2C, the organic layer 16 may be formed over the barrier film 12. In this case, for example, the organic layer 16 may be thick enough for the crack 12A to be embedded therein. For example, the thickness of the organic layer 16 may be smaller than the thickness of the substrate 11, and may also be smaller than or equal to the thickness of the barrier film 12. In this case, the organic layer 16 may include a resin material that is common to a material of the substrate 11. Next, the organic layer 16 may be decomposed and removed by ashing using $O_2$, $O_3$, $N_2$, $SiH_4$, or $NH_3$, for example, until the top surface of the barrier film 12 is exposed. As a result, as illustrated in FIG. 2D, for example, the organic layer 16 may remain inside the crack 12A and at or near the top part of the metallic foreign substance 120. In FIG. 2D, the organic layer 16 remained inside the crack 12A is expressed as the organic part 14, and the organic layer 16 remained at or near the top part of the metallic foreign substance 120 is expressed as the organic part 15. Further, a part of the organic foreign substance 110 exposed above the barrier film 12 may also be removed by the above-mentioned ashing, so that the top surface of the organic foreign substance 110 is leveled with the top surface of the barrier film 12. This is because the organic foreign substance 110 and the organic layer 16 may each include an organic material, and the etching rate of the organic foreign substance 110 is approximately the same as the etching rate of the organic layer 16 in the above-mentioned ashing.

Next, as illustrated in FIG. 1, the barrier film 13 may be formed by, for example, PECVD, over the entire top surface of the barrier film 12 including the organic parts 14 and 15. The material of the barrier film 13 and the material of the barrier film 12 may be identical to or different from each other. In this case, the crack 12A may be filled with the organic part 14, and, the organic part 15 may be provided at or near the top part of the metallic foreign substance 120, so as to cover a part of the side surface of the top part of the metallic foreign substance 120 exposed above the barrier film 12. Further, the top surface of the organic foreign substance 110 may be leveled with the top surface of the barrier film 12. Accordingly, the surface over which the barrier film 13 is formed is approximately flat. As a result, the barrier film 13 may have no such crack 12A as the barrier film 12 has. In this manner, the element-formation substrate 10 may be formed.

Figure 3:
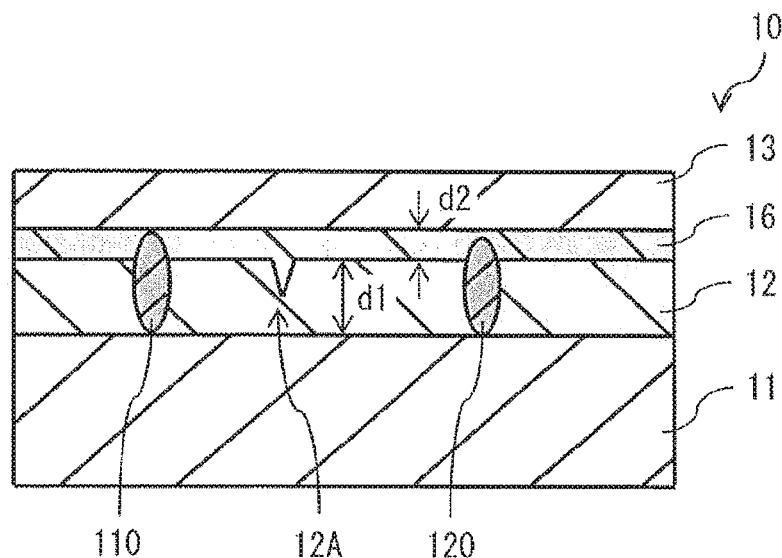
FIG. 3 is a diagram illustrating a modification example of the cross-sectional configuration of the element-formation substrate illustrated in FIG. 1.

Note that, in an example case illustrated in FIG. 3, where the organic layer 16 is formed to have a thickness smaller than the thickness of the substrate 11, the ashing on the organic layer 16 may be omitted, or the organic layer 16 may be subjected to ashing to an extent that the top surface of the barrier film 12 is about to be exposed. Here, in a case where the barrier film 12 has the crack 12A, the element-formation substrate 10 has the organic layer 16 (including the organic part 14). The organic layer 16 fills the crack 12A, and is provided between the barrier film 12 and the barrier film 13. Further, in a case where the metallic foreign substance 120 having a part (top part) protruding from the barrier film 12 exists, the element-formation substrate 10 has the organic layer 16 (including the organic part 15). The organic layer 16 covers the part (top part) of the metallic foreign substance 120 protruding from the barrier film 12, and is provided between the barrier film 12 and the barrier film 13.

Further, in an example case illustrated in FIG. 3, where the organic layer 16 is formed such that a thickness d2 of the organic layer 16 is smaller than or equal to a thickness d1 of the barrier film 12, the ashing on the organic layer 16 may be omitted, or the organic layer 16 may be subjected to ashing to an extent that the top surface of the barrier film 12 is about to be exposed. Here, in a case where the barrier film 12 has the crack 12A, the element-formation substrate 10 has the organic layer 16 (including the organic part 14). The organic layer 16 fills the crack 12A, and is provided between the barrier film 12 and the barrier film 13. Further, in a case where the metallic foreign substance 120 having a part (top part) protruding from the barrier film 12 exists, the element-formation substrate 10 has the organic layer 16 (including the organic part 15). The organic layer 16 covers the part (top part) of the metallic foreign substance 120 protruding from the barrier film 12, and is provided between the barrier film 12 and the barrier film 13.

Figure 4:
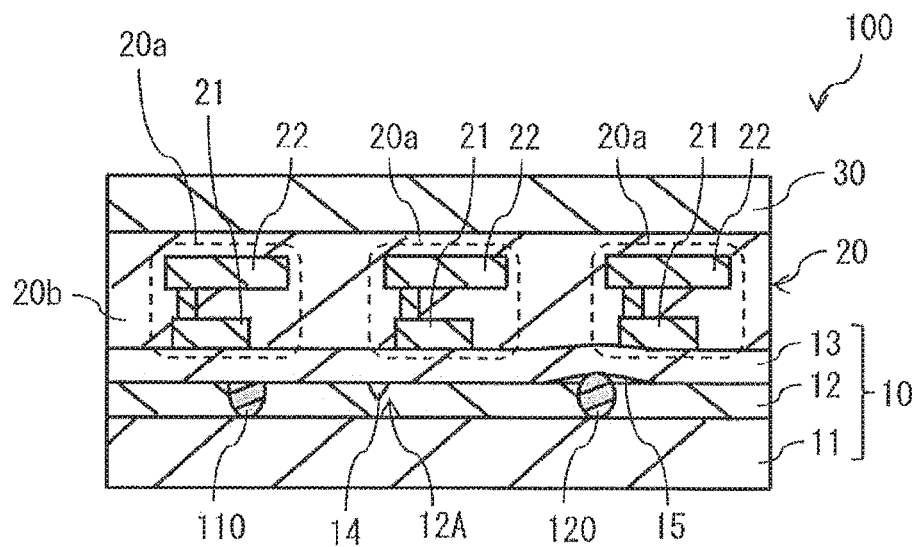
FIG. 4 is a diagram illustrating an example of a cross-sectional configuration of an organic EL panel including the element-formation substrate illustrated in FIG. 1.
Figure 5:
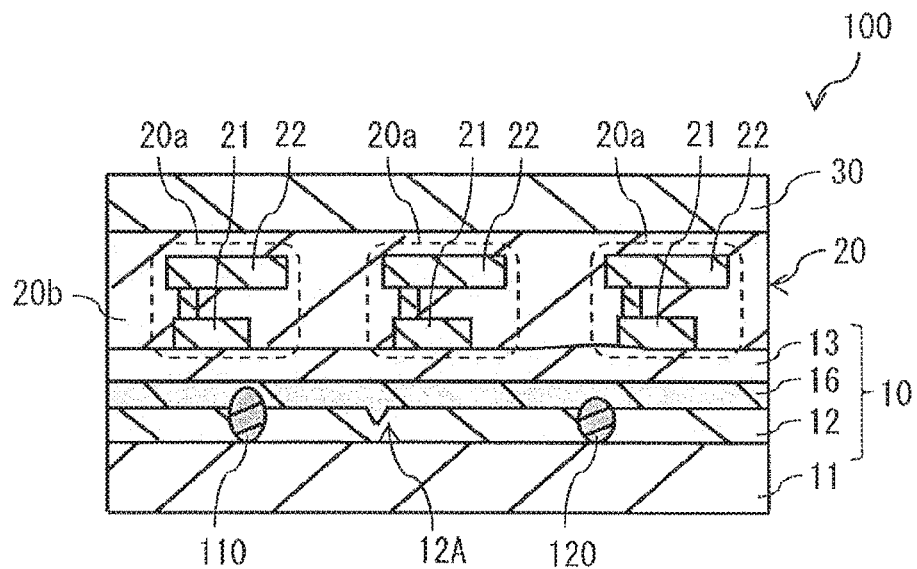
FIG. 5 is a diagram illustrating a modification example of the cross-sectional configuration of the organic EL panel illustrated in FIG. 4.

FIGS. 4 and 5 each illustrate an example of a cross-sectional configuration of an organic EL display device 100 including the element-formation substrate 10. In one embodiment of the disclosure, the organic EL display device 100 corresponds to a specific but non-limiting example of a "light-emitting display device". FIG. 4 illustrates an example of a cross-sectional configuration of the organic EL display device 100 including the element-formation substrate 10 illustrated in FIG. 1, and FIG. 5 illustrates an example of a cross-sectional configuration of the organic EL display device 100 including the element-formation substrate 10 illustrated in FIG. 3. The organic EL display device 100 illustrated in FIGS. 4 and 5 each have a pixel layer 20 and a sealing layer 30 which are stacked in the stated order on the element-formation substrate 10. The organic EL display device 100 may be manufactured by stacking the pixel layer 20 and the sealing layer 30 in the stated order on the element-formation substrate 10.

The pixel layer 20 includes an interlayer insulating film 20b and a plurality of pixels 20a provided within the interlayer insulating film 20b. The interlayer insulating film 20b may include, for example, $SiO_2$, SiN, SiON, $Al_2O_3$, or SiO. Each pixel 20a may include a TFT 21 formed on the element-formation substrate 10 (for example, the barrier film 13) and an organic EL element 22 electrically connected to the TFT 21. The TFT 21 may control a current that flows in the organic EL element 22 on the basis of an external control signal. The current controlled by the TFT 21 may flow through the organic EL element 22. This may cause the organic EL element 22 to emit light. The sealing layer 30 may have a single-layer structure including a resin material such as epoxy resin or vinyl-based resin. Note that the sealing layer 30 may also have, for example, a stacked structure including an inorganic sealing film including SiN formed by PECVD or $Al_2O_3$ formed by ALD, and an organic sealing film including acrylic resin or epoxy resin.

[Effects]

Next, effects of the organic EL display device 100 and a method of manufacturing the organic EL display device 100 according to one example embodiment are described below.

In a sheet-like organic EL display device, glass substrates at the back and front of the sheet-like organic EL display device may be generally omitted. Accordingly, it is important to shield external moisture as a countermeasure against dark spots. In a case where a single-layer barrier film is provided to shield external moisture, a defect such as a crack or a pinhole that occurs in the barrier film becomes a path for the external moisture. Accordingly, in order to prevent the defect from penetrating through the barrier film, it has been suggested that a plurality of barrier films be stacked. Even in the case of adopting the suggestion, a defect at an underlying layer can induce additional defect from the second layer onward, and thus it is not easy to suppress the defect of the barrier film. Further, it has been suggested that an organic film be provided between the stacked barrier films. In this case, induction of additional defect from the second layer onward is suppressed owing to a planarization effect achieved by the organic film. However, the organic film absorbs water during the manufacturing process, which can cause the moisture stored in the organic film to serve as a moisture supply source after the device is completed, causing dark spots to occur.

On the other hand, according to one example embodiment, the organic part 14 and the organic part 15 are formed locally between the barrier film 12 and the barrier film 13. The organic part 14 fills the crack 12A occurred in the barrier film 12, and the organic part 15 is attached around a part of the metallic foreign substance 120 protruding from the barrier film 12. This suppresses occurrence of a defect in the barrier film 13 caused by a defect occurred in the barrier film 12, which is an underlying layer. Moreover, since the organic parts 14 and 15 are provided only locally, the moisture stored in the organic parts 14 and 15 cannot serve as a moisture supply source that causes dark spots to occur after the device is completed. Accordingly, it is possible to further enhance the moisture resistance of the device compared to a currently available sheet-like organic EL display device.

Further, according to one example embodiment, in a manufacturing process, the organic layer 16 having a thickness smaller than a thickness of the substrate 11 is formed on the barrier film 12 that suppresses ingress of moisture, and the barrier film 13 that suppresses ingress of moisture is formed on a surface including the organic layer 16. Accordingly, in a case where the crack 12A occurs in the barrier film 12, some of the organic layer 16 remains in the crack 12A, and in a case where the metallic foreign substance 120 protrudes from the barrier film 12, some of the organic layer 16 is attached around the part of the metallic foreign substance 120 protruding from the barrier film 12. As a result, the surface over which the barrier film 13 is formed is approximately flat, and therefore, the crack 12A which occurs in the barrier film 12 does not occur in the barrier film 13. Additionally, since the organic layer 16 (the organic parts 14 and 15) remains only locally, the moisture stored in the organic parts 14 and 15 cannot serve as a moisture supply source that causes dark spots to occur after the device is completed. Accordingly, it is possible to further enhance the moisture resistance of the device compared to a currently available sheet-like organic EL display device.

Further, according to one example embodiment, in a manufacturing process, in a case where the thickness of the organic layer 16 is smaller than the thickness of the substrate 11 or is smaller than or equal to the thickness of the barrier film 12, the organic layer 16 is ashed until the top surface of the barrier film 12 is exposed or to an extent that the top surface of barrier film 12 is about to be exposed. Accordingly, in a case where the crack 12A occurs in the barrier film 12, some of the organic layer 16 remains in the crack 12A, and in a case where the metallic foreign substance 120 protrudes from the barrier film 12, some of the organic layer is attached around the part of the metallic foreign substance 120 protruding from the barrier film 12. Moreover, the organic foreign substance 110 is removed by ashing. As a result, the surface over which the barrier film 13 is formed is approximately flat, and therefore, the crack 12A which occurs in the barrier film 12 does not occur in the barrier film 13. Additionally, since the volume of the organic layer 16 (the organic parts 14 and 15) becomes smaller by ashing, the moisture stored in the organic layer 16 (the organic parts 14 and 15) cannot serve as a moisture supply source that causes dark spots to occur after the device is completed. Accordingly, it is possible to further enhance the moisture resistance of the device compared to a currently available sheet-like organic EL display device.

Further, according to one example embodiment, in a manufacturing process, the organic layer 16 is formed on the barrier film 12 such that the thickness of the organic layer 16 is smaller than or equal to the thickness of the barrier film 12. Therefore, the moisture stored in the organic parts 14 and 15 cannot serve as a moisture supply source that causes dark spots to occur after the device is completed. Accordingly, it is possible to further enhance the moisture resistance of the device compared to a currently available sheet-like organic EL display device.

Further, according to one example embodiment, in a manufacturing process, the substrate 11 is formed by applying a resin to a support base and causing the resin to cure. Here, the organic layer 16 is a layer formed only for making the surface on which the barrier film 13 is formed approximately flat. Accordingly, in a case where the organic layer 16 includes a resin material that is common to a material of the substrate 11, it is possible to form the organic layer 16 generally without any problems, even if the conditions for forming the organic layer 16 are made common to the conditions for forming the substrate 11, the conditions excluding the film thickness. Therefore, according to one example embodiment, it is possible to manufacture the element-formation substrate 10 highly easily.

2. Modification Example of First Embodiment

[Configuration]

Figure 6:
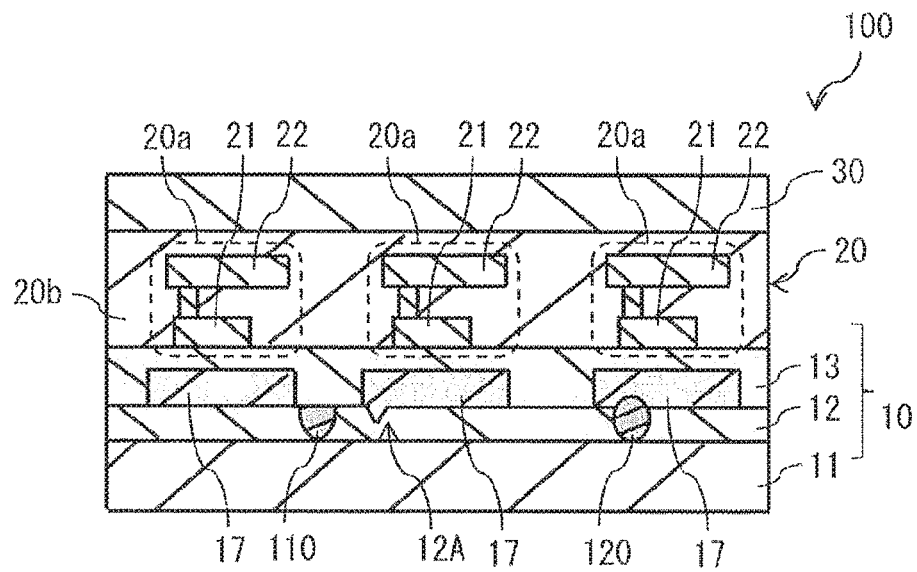
FIG. 6 is a diagram illustrating a modification example of the cross-sectional configuration of the organic EL panel illustrated in FIG. 4.

In any embodiment of the disclosure, the organic layer 16 illustrated in FIG. 5, for example, may be replaced with a plurality of island-shaped organic layers 17 illustrated in FIG. 6, for example. In this case, the plurality of island-shaped organic layers 17 may be respectively provided at regions that are opposed to the respective pixels 20a in the element-formation substrate 10. Each organic layer 17 may be provided on the barrier film 12, and may be provided between the barrier film 12 and the barrier film 13. For example, each organic layer 17 may be thick enough for a crack 12A to be embedded therein. For example, each organic layer 17 may be smaller than the thickness of the substrate 11, and may also be smaller than or equal to the thickness of the barrier film 12. In this case, each organic layer 17 may include a resin material that is common to a material of the substrate 11.

[Manufacturing Method]

Next, a method of manufacturing the organic EL display device 100 according to one modification example is described below. According to one modification example, the processes before forming the organic layer 16 on the barrier film 12 (FIG. 2C) may be the same as those in any embodiment of the disclosure. Accordingly, a process after forming the organic layer 16 on the barrier film 12 is described below. Note that the description is made below of a case where the organic layer 16 includes a photosensitive material.

Figure 7:
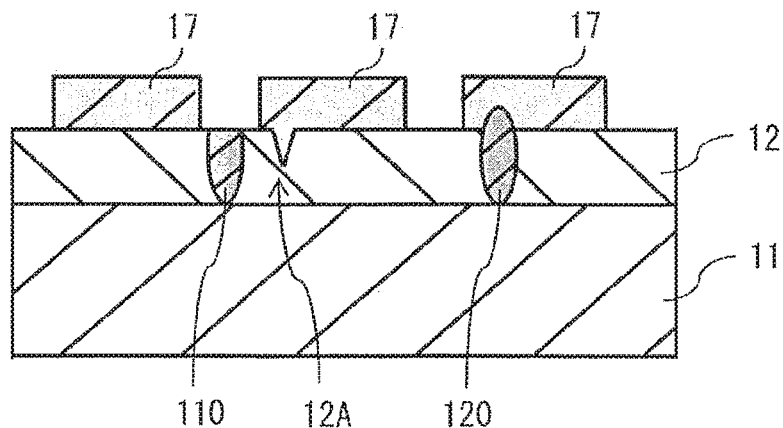
FIG. 7 is a diagram illustrating an example of a method of manufacturing the element-formation substrate included in the organic EL panel illustrated in FIG. 6.

After the organic layer 16 is formed on the barrier film 12, the organic layer 16 may be formed into the plurality of island-shaped organic layers 17 by patterning as illustrated in FIG. 7, for example. In one example, the plurality of island-shaped organic layers 17 may be respectively provided at regions that are opposed to the respective pixels 20a. In this case, the organic layer 17 that fills the crack 12A and the organic layer 17 that covers the metallic foreign substance 120 may be formed at regions that are opposed to the respective pixels 20a. After that, the barrier film 13 is formed on the surface including the organic layers 17 (for example, see FIG. 6).

[Effects]

Next, effects of the organic EL display device 100 according to one modification example are described below.

The organic EL display device 100 according to one modification example may have the plurality of island-shaped organic layers 17 respectively provided at regions that are opposed to the respective pixels 20a. Accordingly, it is possible to suppress occurrence of a defect in each pixel 20a in which a presence of a defect is apt to be troublesome. Therefore, it is possible to further enhance the moisture resistance compared to a currently available sheet-like organic EL display device.

In a process of manufacturing the organic EL display device 100 according to one modification example, an organic layer including a photosensitive material is formed as the organic layer 16, the organic layer 16 is patterned, and the plurality of island-shaped organic layers 17 is formed. Further, the barrier film 13 is formed on a surface including the island-shaped organic layers 17. Accordingly, it is possible to suppress occurrence of a defect in each pixel 20a in which a presence of a defect is apt to be troublesome. Therefore, it is possible to further enhance the moisture resistance compared to a currently available sheet-like organic EL display device.

3. Second Embodiment

[Configuration]

Figure 8:
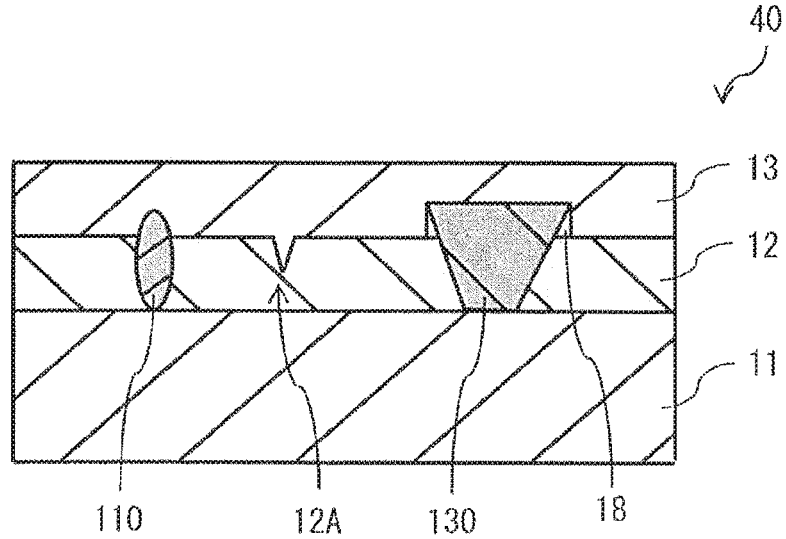
FIG. 8 is a diagram illustrating an example of a cross-sectional configuration of an element-formation substrate according to one example embodiment of the disclosure.

FIG. 8 is a diagram illustrating an example of a cross-sectional configuration of an element-formation substrate 40 according to one example embodiment of the disclosure. The element-formation substrate 40 may be suitably used as a substrate for forming an element easily influenced by moisture. The element mentioned herein refers to an element whose characteristics are easily degraded due to ingress of moisture. Non-limiting examples of the element easily influenced by moisture include an organic EL element and an active element including an oxide semiconductor or low-temperature polycrystalline silicon.

The element-formation substrate 40 has two barrier films 12 and 13 provided on a substrate 11. A foreign substance can be mixed in the element-formation substrate 40 during a process of manufacturing an element-formation substrate 40. Non-limiting examples of the foreign substance that can be mixed in the element-formation substrate 40 include, as illustrated in FIG. 8, an organic foreign substance 110 and a metallic foreign substance 130. The organic foreign substance 110 and the metallic foreign substance 130 may be attached to a surface on which the barrier film 12 is provided (i.e., a top surface of the substrate 11) during a process of manufacturing the element-formation substrate 40.

The organic foreign substance 110 and the metallic foreign substance 130 may penetrate through the barrier film 12. A top part of the organic foreign substance 110 may protrude from the barrier film 12, and a side surface of the top part of the organic foreign substance 110 may be in a forward tapered shape. A top part of the metallic foreign substance 130 may protrude from the barrier film 12, and a side surface of the top part of the metallic foreign substance 130 may be in an inversely tapered shape. An organic part 18 may be attached around the top part of the metallic foreign substance 130. The organic part 18 may be formed at a region which is hidden by the metallic foreign substance 130 when the metallic foreign substance 130 is viewed from above (i.e., a shade of the metallic foreign substance 130). That is, in a case where the metallic foreign substance 130 having a part (top part) protruding from the barrier film 12 exists, the element-formation substrate 40 may include the organic part 18 attached around the part of the metallic foreign substance 130 protruding from the barrier film 12 (i.e., the shade of the metallic foreign substance 130). The organic part 18 may include, for example, a resin material that is common to a material of the substrate 11. Note that the organic part 18 may include a resin material that is different from a material of the substrate 11. The organic part 18 may join the surface of the metallic foreign substance 130 with the surface of the barrier film 12 more smoothly compared to a case where the organic part 18 is not provided.

[Manufacturing Method]

Figure 9A:
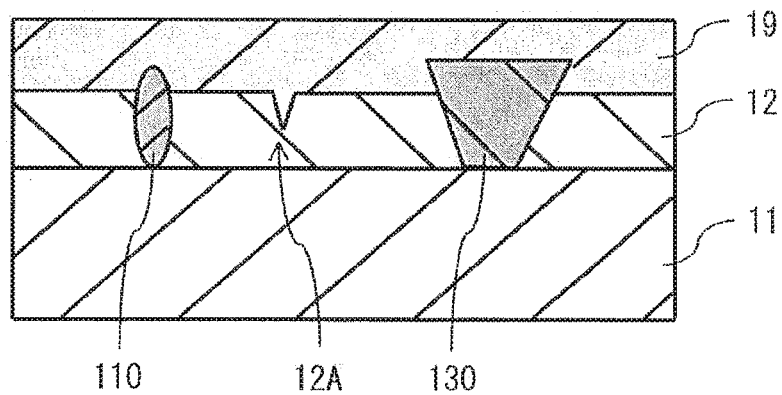
FIG. 9A is a diagram illustrating an example of a method of manufacturing the element-formation substrate illustrated in FIG. 8.
Figure 9B:
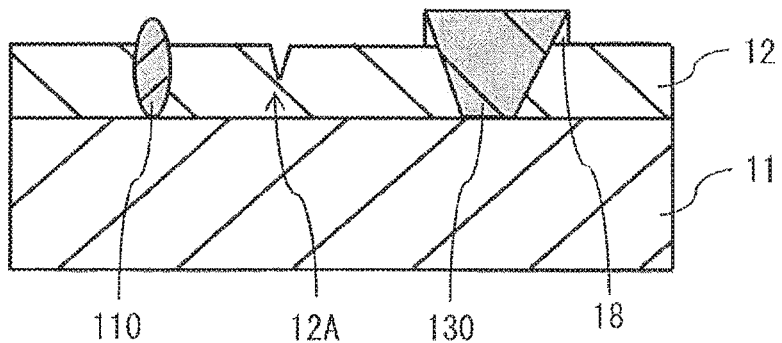
FIG. 9B is a diagram illustrating an example of a manufacturing process following the process illustrated in FIG. 9A.

Next, a method of manufacturing the element-formation substrate 40 is described below. Note that a process is hereinafter described of a case where the organic part 18 and an organic layer 19 (to be described later) each include a photosensitive material. FIGS. 9A and 9B illustrate a process of manufacturing the element-formation substrate 40. First, the substrate 11 may be formed by applying a resin over a support base and causing the resin to cure. Here, let us assume that foreign substances (the organic foreign substance 110 and the metallic foreign substance 130), for example, are attached on the substrate 11. In this case, the substrate 11 may include a resin material that is common to a material of the organic layer 19 to be formed later. Next, the barrier film 12 may be formed over the substrate 11 using PECVD, for example. In this example, the organic foreign substance 110 and the metallic foreign substance 130 penetrate through the barrier film 12, and a crack 12A occurs on the top surface of the barrier film 12.

Next, as illustrated in FIG. 9A, the organic layer 19 may be formed over the barrier film 12. In this case, for example, the organic layer 19 may be thick enough for the crack 12A to be embedded therein. For example, the thickness of the organic layer 19 may be smaller than the thickness of the substrate 11, and may also be smaller than or equal to the thickness of the barrier film 12. In this case, the organic layer 19 may include a resin material that is common to a material of the substrate 11. Next, the organic layer 19 may be subjected to exposing and developing directly (i.e., without using a mask), for example. As a result, as illustrated in FIG. 9B, for example, the organic layer 19 may remain around the top part of the metallic foreign substance 130 (i.e., a shade of the metallic foreign substance 130). In FIG. 9B, the organic layer 19 remained around the top part of the metallic foreign substance 130 (i.e., a shade of the metallic foreign substance 130) is expressed as the organic part 18.

Next, as illustrated in FIG. 8, the barrier film 13 may be formed by using, for example, PECVD, over the top surface including the organic part 18 (in one example, an entire top surface of the barrier film 12 including the organic part 18. At or near the top part of the metallic foreign substance 130, a part of the side surface of the top part of the metallic foreign substance 130 exposed above the barrier film 12 is covered with the organic part 18. Accordingly, the surface over which the barrier film 13 is formed is approximately flat. As a result, the barrier film 13 may have no such crack 12A as the barrier film 12 has. In this manner, the element-formation substrate 40 may be formed.

Figure 10:
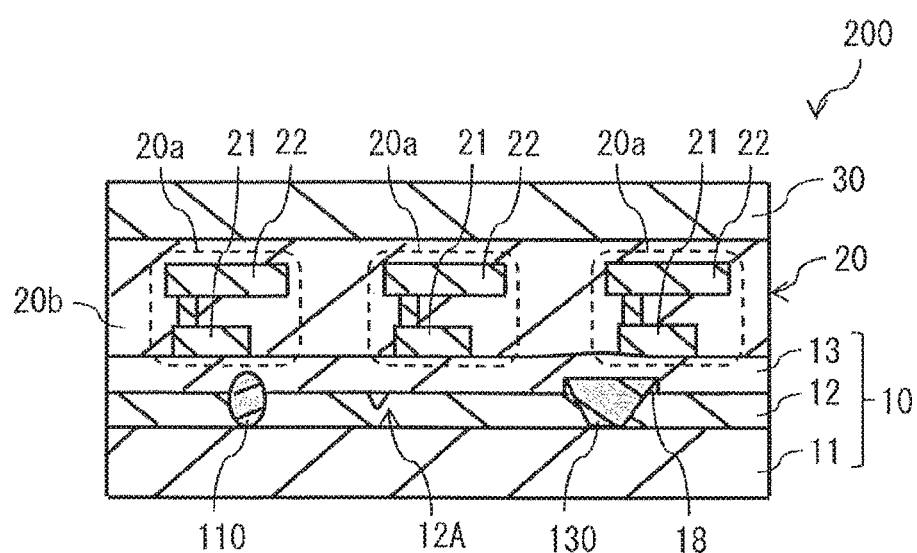
FIG. 10 is a diagram illustrating an example of a cross-sectional configuration of an organic EL panel including the element-formation substrate illustrated in FIG. 8.

FIG. 10 illustrates an example of a cross-sectional configuration of an organic EL display device 200 including the element-formation substrate 40. FIG. 10 illustrates an example of a cross-sectional configuration of the organic EL display device 200 including the element-formation substrate 40 illustrated in FIG. 8. The organic EL display device 200 illustrated in FIG. 10 has a pixel layer 20 and a sealing layer 30 which are stacked in the stated order on the element-formation substrate 40. The organic EL display device 200 is manufactured by stacking the pixel layer 20 and the sealing layer 30 in the stated order on the element-formation substrate 40.

[Effects]

Next, effects of the organic EL display device 200 and a method of manufacturing the organic EL display device 200 according to one example embodiment are described below.

According to one example embodiment, locally formed between the barrier film 12 and the barrier film 13 may be the organic part 18 attached around a part of the metallic foreign substance 130 protruding from the barrier film 12. This suppresses occurrence of a defect in the barrier film 13 caused by a defect occurred in the barrier film 12, which is an underlying layer. Moreover, since the organic part 18 is provided only locally, the moisture stored in the organic part 18 cannot serve as a moisture supply source that causes dark spots to occur after the device is completed. Accordingly, it is possible to further enhance the moisture resistance of the device compared to a currently available sheet-like organic EL display device.

Although the disclosure is described hereinabove with reference to the example embodiments and modification examples, these embodiments and modification examples are not to be construed as limiting the scope of the disclosure and may be modified in a wide variety of ways. It should be appreciated that the effects described herein are mere examples. Effects of an example embodiment and modification examples of the disclosure are not limited to those described herein. The disclosure may further include any effects other than those described herein.

It is possible to achieve at least the following configurations from the above-described example embodiments of the disclosure.

(1) A method of manufacturing a light-emitting display device, the method including:
  forming a first barrier film on a substrate, the first barrier film suppressing ingress of moisture;
  forming an organic layer on the first barrier film, the organic layer having a thickness smaller than a thickness of the substrate; and
  forming a second barrier film on a surface including the organic layer, the second barrier film suppressing ingress of moisture.

(2) The method of manufacturing the light-emitting display device according to (1), in which upon forming the organic layer, the organic layer is ashed until a top surface of the first barrier film is exposed or to an extent that the top surface of the first barrier film is about to be exposed.

(3) The method of manufacturing the light-emitting display device according to (1) or (2), in which, upon forming the organic layer on the first barrier film, the organic layer is formed to have a thickness smaller than or equal to a thickness of the first barrier film.

(4) The method of manufacturing the light-emitting display device according to (1), in which,
  upon forming the organic layer, the organic layer includes a photosensitive material, the organic layer is patterned, and a plurality of island-shaped organic layers is formed, and
  upon forming the second barrier film, the second barrier film is formed on a surface including the island-shaped organic layers.

(5) The method of manufacturing the light-emitting display device according to (1), in which,
  upon forming the organic layer, the organic layer includes a photosensitive material, the organic layer is directly exposed and developed, and an organic part is formed at a shade of a foreign substance, and,
  upon forming the second barrier film, the second barrier film is formed on a surface including the organic part.

(6) The method of manufacturing the light-emitting display device according to any one of (1) to (5), in which, upon forming the first barrier film, the substrate is formed by applying a resin to a support base and causing the resin to cure.

(7) The method of manufacturing the light-emitting display device according to any one of (1) to (6), in which, upon forming the organic layer, the organic layer is formed using a resin material that is common to a material of the substrate.

(8) A light-emitting display device including:
  an element-formation substrate including a first barrier film and a second barrier film provided on a substrate, the first barrier film and the second barrier film being provided in the stated order from the substrate and suppressing ingress of moisture; and
  a plurality of pixels provided on the element-formation substrate,
  the element-formation substrate further including an organic part that fills a crack occurred in the first barrier film, or that is attached around a part of a metallic foreign substance, the part of the metallic foreign substance protruding from the first barrier film.

(9) A light-emitting display device including:
  an element-formation substrate including a first barrier film and a second barrier film provided on a substrate, the first barrier film and the second barrier film being provided in the stated order from the substrate and suppressing ingress of moisture; and
  a plurality of pixels provided on the element-formation substrate,
  the element-formation substrate including an organic layer that fills a crack occurred in the first barrier film, or that covers a part of a metallic foreign substance, the part of the metallic foreign substance protruding from the first barrier film, the organic layer being provided between the first barrier film and the second barrier film.

(10) The light-emitting display device according to (9), in which the organic layer is provided at a region that is opposed to each of the plurality of pixels.

(11) The light-emitting display device according to any one of (8) to (10), in which the substrate includes any one of polyimide, polyethylene terephthalate, polyether sulfone, polyethylene naphthalate, or polycarbonate.

(12) The light-emitting display device according to any one of (8) to (11), in which the first barrier film includes any one of $SiO_2$, SiN, SiON, $Al_2O_3$, or SiO.

(13) The light-emitting display device according to any one of (8) to (11), in which the first barrier film includes a stacked film including two or more selected from the group consisting of $SiO_2$, SiN, SiON, $Al_2O_3$, and SiO.

(14) The light-emitting display device according to (10), in which the organic layer has an island shape.

(15) The light-emitting display device according to (8), in which a top part of the metallic foreign substance is in contact with the second barrier film.

According to the method of manufacturing the light-emitting display device according to an example embodiment of the disclosure, the organic layer is provided on the first barrier film provided on the substrate. The organic layer has the thickness smaller than the thickness of the substrate, and the second barrier film is provided on the surface including the organic layer. The second barrier film suppresses ingress of moisture. This allows moisture resistance to be further enhanced.

According to the light-emitting display device according to an example embodiment of the disclosure, the organic part is further included. The organic part fills a crack occurred in the first barrier film, or that is attached around a part of a metallic foreign substance, the part of the metallic foreign substance protruding from the first barrier film. This allows moisture resistance to be further enhanced.

According to the light-emitting display device according to an example embodiment of the disclosure, the organic layer is further included. The organic layer fills a crack occurred in the first barrier film, or that covers a part of a metallic foreign substance, the part of the metallic foreign substance protruding from the first barrier film. The organic layer is provided between the first barrier film and the second barrier film. This allows moisture resistance to be further enhanced.

Note that the effects described herein are not necessarily limitative, and may be any effects described in the disclosure.

Although the technology has been described in terms of exemplary embodiments, this disclosure is not limited thereto. One of ordinary skill in the art would appreciate that variations may be made in the described embodiments by persons skilled in the art without departing from the scope of the technology as defined by the following claims. The limitations in the claims are to be interpreted broadly based on the language employed in the claims and not limited to examples described in this specification or during the prosecution of the application, and the examples are to be construed as non-exclusive. The use of the terms first, second, etc. do not denote any order or importance, but rather the terms first, second, etc. are used to distinguish one element from another. The term "substantially" and its variations are defined as being largely but not necessarily wholly what is specified as understood by one of ordinary skill in the art. The term "about" or "approximately" as used herein can allow for a degree of variability in a value or range. Moreover, no element or component in this disclosure is intended to be dedicated to the public regardless of whether the element or component is explicitly recited in the following claims.

What is claimed is:

1. A light-emitting display device, comprising:
   an element-formation substrate including a first barrier film and a second barrier film provided on a substrate, the first barrier film being provided on and in direct contact with the substrate and the second barrier film being provided on an in direct contact with the first barrier film in the stated order from the substrate and suppressing ingress of moisture; and
   a plurality of pixels provided on the element-formation substrate,
   the element-formation substrate further including an organic part that fills a crack occurred in the first barrier film, or that is attached around a part of a metallic foreign substance, the part of the metallic foreign substance protruding from the first barrier film.

2. A light-emitting display device, comprising:
   an element-formation substrate including a first barrier film and a second barrier film provided on a substrate, the first barrier film and the second barrier film being provided in the stated order from the substrate and suppressing ingress of moisture; and
   a plurality of pixels provided on the element-formation substrate,
   the element-formation substrate including an organic layer that fills a crack occurred in the first barrier film, and that covers a part of a metallic foreign substance, the part of the metallic foreign substance protruding from the first barrier film, the organic layer being provided between the first barrier film and the second barrier film, and the organic layer having a thickness smaller than a thickness of the first barrier film.

3. The light-emitting display device according to claim 2, wherein the organic layer is provided at a region that is opposed to each of the plurality of pixels.

4. The light-emitting display device according to claim 1, wherein the substrate comprises any one of polyimide, polyethylene terephthalate, polyether sulfone, polyethylene naphthalate, or polycarbonate.

5. The light-emitting display device according to claim 1, wherein the first barrier film comprises any one of $SiO_2$, SiN, SiON, $Al_2O_3$, or SiO.

6. The light-emitting display device according to claim 1, wherein the first barrier film comprises a stacked film including two or more selected from the group consisting of $SiO_2$, SiN, SiON, $Al_2O_3$, and SiO.

7. The light-emitting display device according to claim 3, wherein the organic layer has an island shape.

8. The light-emitting display device according to claim 1, wherein a top part of the metallic foreign substance is in contact with the second barrier film.

* * * * *